(12) United States Patent
Kakinuma

(10) Patent No.: US 11,942,339 B2
(45) Date of Patent: Mar. 26, 2024

(54) SHEET ATTACHING APPARATUS

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 186 days.

(21) Appl. No.: 17/649,004

(22) Filed: Jan. 26, 2022

(65) Prior Publication Data

US 2022/0254664 A1 Aug. 11, 2022

(30) Foreign Application Priority Data

Feb. 9, 2021 (JP) ................. 2021-019394

(51) Int. Cl.
*H01L 21/67* (2006.01)
*B29C 63/00* (2006.01)
*B29C 63/02* (2006.01)
*B29K 101/12* (2006.01)
*B29L 31/34* (2006.01)

(52) U.S. Cl.
CPC .... *H01L 21/67132* (2013.01); *B29C 63/0004* (2013.01); *B29C 63/02* (2013.01); *B29K 2101/12* (2013.01); *B29L 2031/34* (2013.01)

(58) Field of Classification Search
CPC ......... H01L 21/67132; H01L 21/67092; H01L 21/6836; H01L 2221/68327; B29C 63/0004; B29C 63/02; B29K 2101/12; B29L 2031/34; B65H 35/06; B65H 37/04; B65H 2701/1722; B65H 2701/175
See application file for complete search history.

(56) References Cited

U.S. PATENT DOCUMENTS 4,925,515 A * 5/1990 Yoshimura .......... H01L 23/3164
156/530
6,080,263 A * 6/2000 Saito ................. H01L 21/67092
156/522

FOREIGN PATENT DOCUMENTS

JP 2011109006 A * 6/2011
JP 2017050536 A 3/2017

OTHER PUBLICATIONS

JP2011109006A Machine Translation of Description (Year: 2023).*

* cited by examiner

*Primary Examiner* — Cynthia L Schaller
(74) *Attorney, Agent, or Firm* — Greer, Burns & Crain, Ltd.

(57) ABSTRACT

A sheet attaching apparatus includes a sheet attaching section that attaches a sheet to a workpiece, and a sheet cutting section that cuts off the sheet from the workpiece along an outer edge. The sheet cutting section includes a chuck table that holds the workpiece, a sheet holding section that detachably holds a peripheral portion of the sheet, a cutting section that cuts the sheet along the outer edge of the workpiece, and a sheet accommodating section that accommodates an unnecessary part of the sheet cut and dropped due to release of holding by the sheet holding section.

4 Claims, 7 Drawing Sheets

SHEET ATTACHING APPARATUS

BACKGROUND OF THE INVENTION

Field of the Invention

The present invention relates to a sheet attaching apparatus.

Description of the Related Art

At the time of grinding a wafer formed with semiconductor devices or processing the wafer by a laser beam or a cutting blade, a sheet attaching apparatus for attaching an adhesive tape, a sheet of a thermoplastic resin or the like to the wafer is used for protecting the devices (see, for example, Japanese Patent No. 6312343).

SUMMARY OF THE INVENTION

In the sheet attaching apparatus described in Japanese Patent No. 6312343, a sheet having a width larger than that of the wafer is attached to the wafer, after which the protruding sheet is cut off. In a case where the sheet is attached in a state of being wound around a roll and thereafter the sheet is hollowed out, the cut-out sheet is removed by taking up the roll. However, in a case where the sheet cut out from the roll is attached and thereafter the sheet is hollowed out, a mechanism for removing the hollowed unnecessary sheet is required.

Accordingly, it is an object of the present invention to provide a sheet attaching apparatus capable of easily removing an unnecessary part of a sheet having attached to the wafer.

In accordance with an aspect of the present invention, there is provided a sheet attaching apparatus for attaching a sheet to a plate-shaped workpiece to form a sheeted workpiece. The sheet attaching apparatus includes a sheet attaching section that attaches the sheet having an area larger than that of the workpiece to the workpiece, and a sheet cutting section that cuts off the sheet attached by the sheet attaching section from the workpiece along a periphery of the workpiece. The sheet cutting section includes a chuck table that holds the workpiece by a holding surface smaller than the workpiece, a sheet holding section that detachably holds a peripheral portion of the sheet attached to the workpiece held by the chuck table, a cutting section that cuts the sheet along the periphery of the workpiece, and a sheet accommodating section that accommodates the sheet cut and dropped due to release of holding by the sheet holding section. The cutting section has a cutter and a pressing section that presses the cut sheet toward the sheet accommodating section.

Preferably, the pressing section is a rotating roller that presses the sheet while moving relative to the sheet together with the cutter.

The present invention produces an effect that an unnecessary part of the sheet having been attached to the wafer can easily be removed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
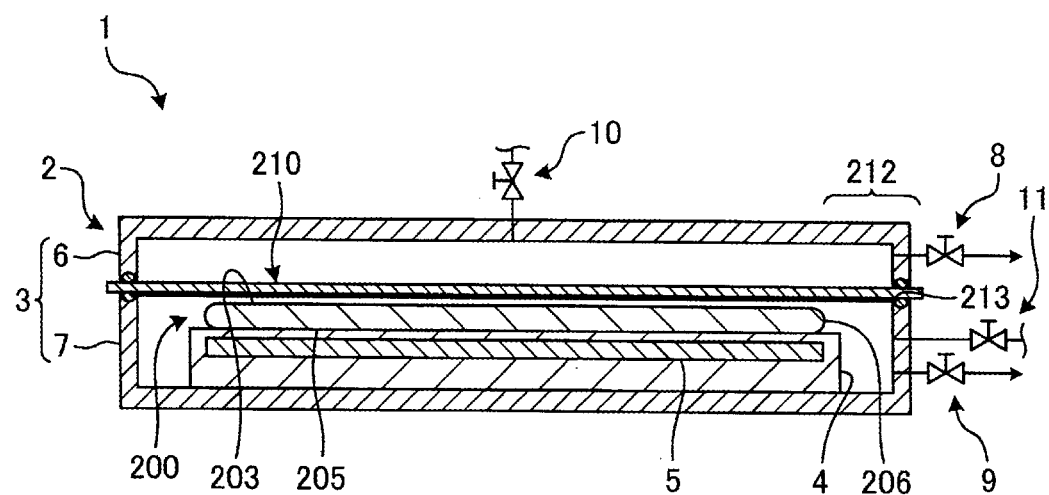
FIG. 1 is a sectional view schematically depicting a configuration example of a sheet attaching section and a sheet cutting section of a sheet attaching apparatus according to an embodiment of the present invention.
Figure 1:
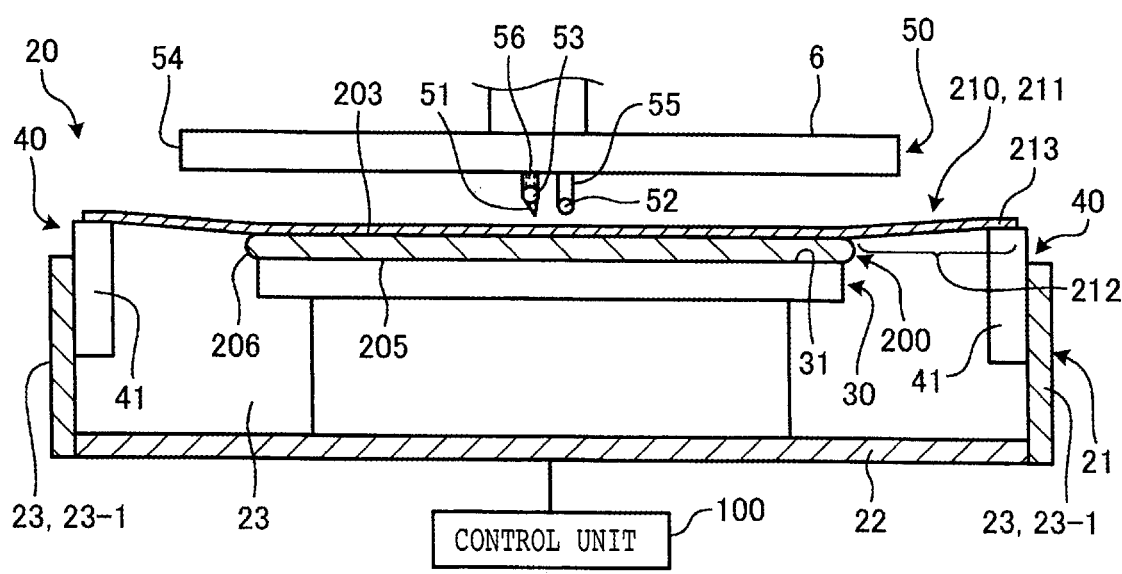

An embodiment of the present invention will be described in detail below referring to the drawings. The present invention is not to be limited by the contents described in the following embodiment. In addition, the constituent elements described below include those which can easily be conceived by a person skilled in the art and those which are substantially the same. Further, the configurations described below can be combined as required. Besides, various omission, replacement, or modification of the configuration can be made in such ranges as not to depart from the gist of the present invention.

Figure 2:
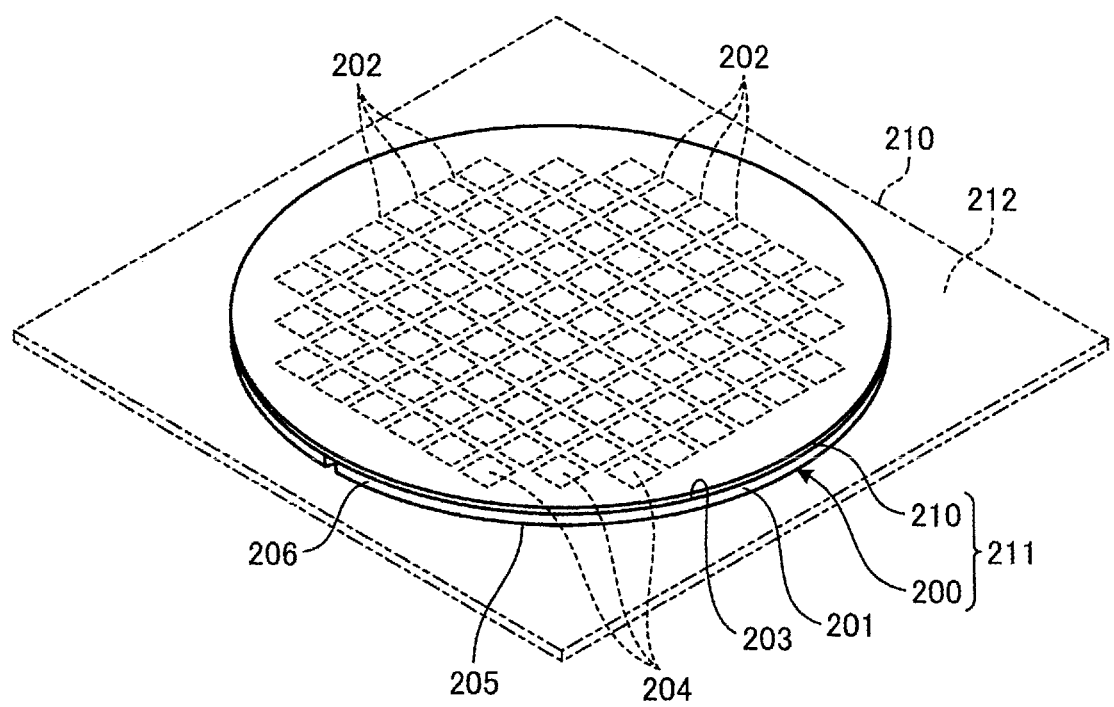
FIG. 2 is a perspective view of a workpiece to which a sheet has been attached by the sheet attaching apparatus according to the embodiment.
Figure 3:
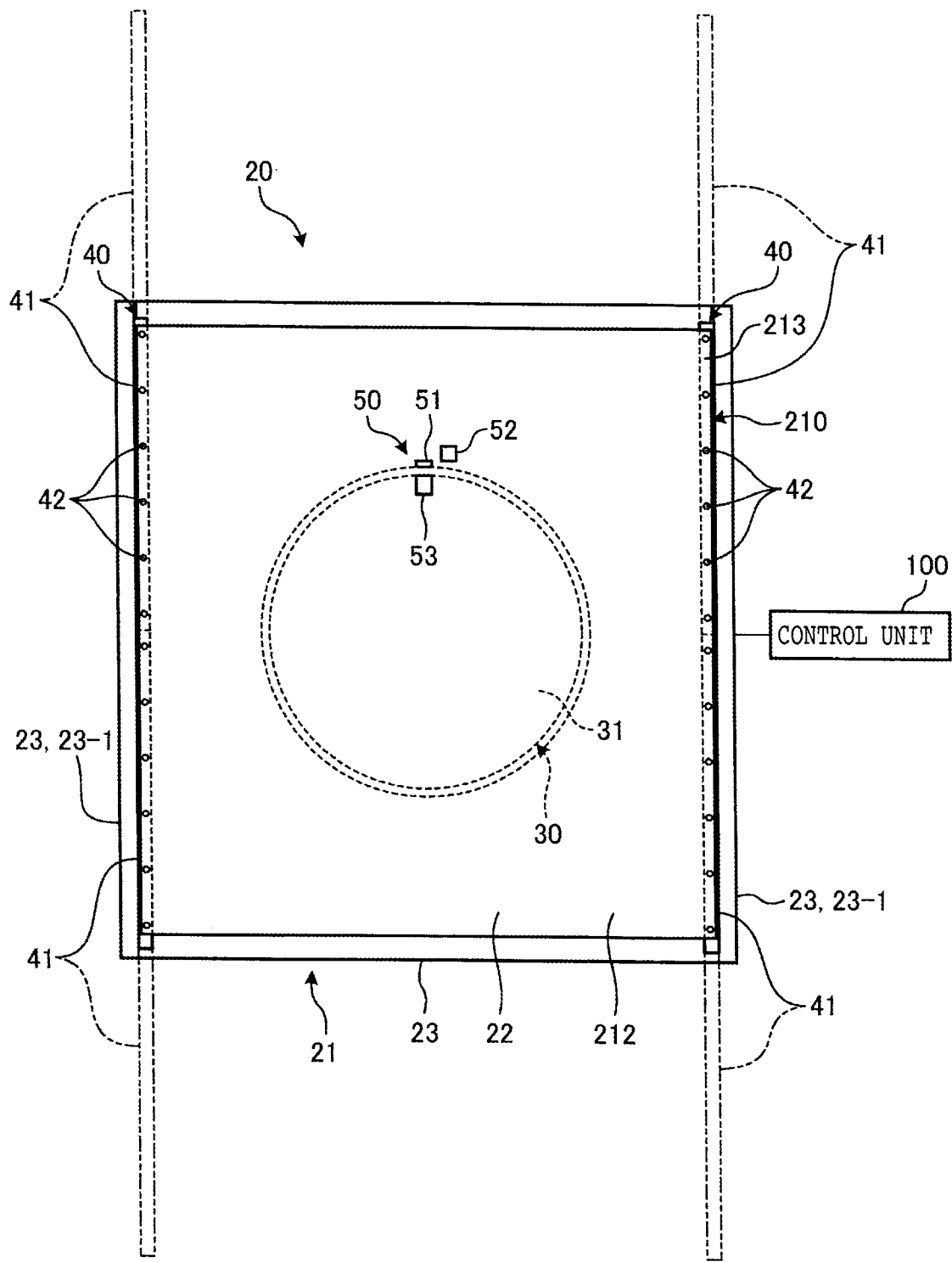
FIG. 3 is a plan view of the sheet cutting section depicted in FIG. 1.

A sheet attaching apparatus according to an embodiment of the present invention will be described based on the drawings. FIG. 1 is a sectional view schematically depicting a configuration example of a sheet attaching section and a sheet cutting section of the sheet attaching apparatus according to the embodiment. FIG. 2 is a perspective view of a workpiece to which a sheet has been attached by the sheet attaching apparatus according to the embodiment. FIG. 3 is a plan view of the sheet cutting section depicted in FIG. 1.

The sheet attaching apparatus 1 depicted in FIG. 1 according to the embodiment is an apparatus for attaching a sheet 210 to a front surface 203 of a workpiece 200 depicted in FIG. 2, to form a sheeted workpiece 211. The workpiece 200 to which the sheet 210 is attached by the sheet attaching apparatus 1 according to the embodiment is a wafer such as a disk-shaped semiconductor wafer or an optical device wafer with a substrate 201 including silicon (Si), sapphire ($Al_2O_3$), gallium arsenide (GaAs), or silicon carbide (SiC), for example.

As depicted in FIG. 2, the workpiece 200 includes devices 204 each formed in each of regions of the front surface 203 partitioned by a plurality of intersecting streets 203. The device 204 is, for example, an integrated circuit such as an integrated circuit (IC) or a large scale integration (LSI) circuit, an image sensor such as a charge coupled device (CCD) or a complementary metal oxide semiconductor (CMOS), micro electro mechanical systems (MEMS), or the like.

In the embodiment, the workpiece 200 has the sheet 210 attached to the front surface 203 side, a back surface 205 opposite to the front surface 203 is ground in a state in which the front surface 203 side is held by a chuck table of a grinding apparatus through the sheet 210, whereby the workpiece 200 is thinned to a predetermined finished thickness. After thinned, the workpiece 200 is divided along the streets 202 into the individual devices 204.

The sheet 210 is formed in a sheet shape from a thermoplastic resin, with the area of a plan-view shape thereof larger than the area of the workpiece 200. In the embodiment, the sheet 210 is formed in a rectangular shape, with both the width and the length of a plan-view shape thereof larger than the outside diameter of the workpiece 200. In the embodiment, a predetermined length of the sheet 210 wound around a cylindrical roll is cut out, after which the sheet 210 cut out from the roll is attached to the front surface 203 of the workpiece 200 by the sheet attaching apparatus 1.

The sheet 210 has both the front surface and the back surface thereof formed flat. The sheet 210 includes a thermoplastic resin having flexibility and non-tacky property, and does not include a glue layer including an adhesive resin. In addition, the thermoplastic resin constituting the sheet 210 has a contractible and extendable property, is softened when heated in excess of a softening point thereof, and is contracted when further heated. In the embodiment, the sheet 210 includes a resin which is transparent or semi-transparent to visible light. In the embodiment, the sheet 210 is a sheet of a polymer synthesized from an alkene as a monomer, and includes, for example, polyethylene, polypropylene, polystyrene, or the like as the thermoplastic resin. In the embodiment, the thickness of the sheet 210 is equal to or more than 50 µm and equal to or less than 150 µm.

The sheet attaching apparatus 1 according to the embodiment is a device for attaching, to the workpiece 200, the sheet 210 which has been cut out in a predetermined length and which is depicted in broken line in FIG. 2, and cutting the sheet 210 along an outer edge 206 which is the periphery of the workpiece 200, to form the sheeted workpiece 211 depicted in solid line in FIG. 2.

As depicted in FIG. 1, the sheet attaching apparatus 1 includes a sheet attaching section 2 that attaches, to the workpiece 200, the rectangular sheet 210 larger in area in a plan-view shape than the workpiece 200; a sheet cutting section 20 that cuts the sheet 210 attached by the sheet attaching section 2 along the outer edge 206 of the workpiece 200 and cuts away an unnecessary part 212 (depicted in FIG. 6) of the sheet 210 from the workpiece 200; and a conveying section (not illustrated) that conveys the workpiece 200 with the sheet 210 attached thereto from the sheet attaching section 2 to the sheet cutting section 20. Note that the unnecessary part 212 refers to a part of the rectangular sheet 210 attached to the workpiece 200, the part being protruded more to the periphery side than the outer edge 206.

As depicted in FIG. 1, the sheet attaching section 2 includes a pressure reduction chamber 3, a support table 4, and a heating unit 5. The pressure reduction chamber 3 includes an upper housing 6 and a lower housing 7 that fixes the sheet 210 while located on opposite sides of a peripheral part 213 of the sheet 210 (a region of the unnecessary part 212 of the sheet 210, the region being on the periphery side); pressure reduction units 8 and 9 connected respectively to the housings 6 and 7; and atmospheric air opening units 10 and 11 connected respectively to the housings 6 and 7.

Of the pressure reduction chamber 3, the part between the upper housing 6 and the sheet 210 and the part between the sheet 210 and the lower housing 7 are kept hermetically sealed when the sheet 210 is interposed between the housings 6 and 7. The pressure reduction units 8 and 9 reduces the gas pressures inside the housings 6 and 7, respectively. The atmospheric air opening units 10 and 11 open the inside of the housings 6 and 7 to the atmospheric air.

The support table 4 is disposed inside the lower housing 7, and has the back surface 205 of the workpiece 200, the back surface 205 being placed on an upper surface of the support table 4. The heating unit 5 is disposed inside the support table 4, and heats the sheet 210 through the support table 4 and the workpiece 200.

The sheet attaching section 2 fixes the sheet 210 while having the workpiece 200 mounted on the upper surface of the support table 4 and interposing the sheet 210 between the housings 6 and 7 of the pressure reduction chamber 3. The sheet attaching section 2 reduces the pressures inside the housings 6 and 7 by the pressure reduction units 8 and 9, and heats the workpiece 200 by the heating unit 5 through the support table 4. The sheet attaching section 2 opens the inside of the upper housing 6 to the atmospheric air by the atmospheric air opening unit 10 connected to the upper housing 6, brings the sheet 210 into close contact with the front surface 203 of the workpiece 200 by a differential pressure in the housings 6 and 7, heats and softens the sheet 210 by the heating unit 5, and adheres the sheet 210 to the front surface 203 of the workpiece 200.

As depicted in FIGS. 1 and 3, the sheet cutting section 20 has a sheet accommodating section 21, a chuck table 30, a sheet holding section 40, and a cutting section 50.

The sheet accommodating section 21 is for accommodating the unnecessary part 212 of the sheet 210, the unnecessary part 212 being cut along the outer edge 206 of the workpiece 200 and dropped due to release of holding by the sheet holding section 40. The sheet accommodating section 21 includes a bottom plate 22 parallel to a horizontal direction and a plurality of peripheral plates 23 erected from an outer edge of the bottom plate 22. The plan-view shape of the bottom plate 22 of the sheet accommodating section 21 is a rectangular shape larger than the plan-view shape of the sheet 210 yet to be cut along the outer edge 206 of the workpiece 200.

The chuck table 30 is for holding the workpiece 200 with a holding surface 31 smaller than the workpiece 200. The chuck table 30 is disposed in the center of the bottom plate 22 of the sheet accommodating section 21, and is formed in a disk shape with an outside diameter smaller than the outside diameter of the workpiece 200. The chuck table 30 has the workpiece 200 mounted on the upper surface thereof, which is the holding surface 31 for holding the workpiece 200. The chuck table 30 holds the back surface 205 of the workpiece 200 with the sheet 210 attached to the front surface 203 thereof on the holding surface 31.

The sheet holding section 40 is for detachably holding the peripheral part 213 of the sheet 210 attached to the workpiece 200 held by the chuck table 30. The sheet holding sections 40 are provided respectively on a pair of opposed peripheral plates 23 (hereinafter denoted by a reference symbol 23-1) of the sheet accommodating section 21. Each sheet holding section 40 includes a pair of sheet holding plates 41 formed in a plate shape parallel to the peripheral plates 23-1 and aligned in the direction parallel to the peripheral plates 23-1. The sheet holding plates 41 of each sheet holding section 40 are moved along the peripheral plates 23-1 by a moving unit (not illustrated) between holding positions depicted in solid line in FIG. 3 where they are close to each other and hold the peripheral part 213 of the sheet 210 on upper surfaces thereof and holding release positions depicted in broken line in FIG. 3 where they are spaced from each other and do not hold the peripheral part 213 of the sheet 210.

The upper surfaces of the sheet holding plates 41 of each sheet holding section 40 are provided with a plurality of suction holes 42 connected to a vacuum drive source (not illustrated). The suction holes 42 are arranged on upper surfaces of the sheet holding plates 41 at intervals along the longitudinal direction of the sheet holding plates 41. The sheet holding section 40 holds under suction the peripheral part 213 of the sheet 210 on the upper surfaces of the sheet holding plate 41, by the suction holes 42 of the sheet holding plates 41 positioned at the holding positions being sucked by the vacuum drive source.

The sheet holding section 40 releases the holding of the peripheral part 213 of the sheet 210, by stopping the suction of the suction holes 42 and positioning the sheet holding plates 41 at the holding release positions. In this way, the sheet holding section 40 detachably holds the peripheral part 213 of the sheet 210 attached to the workpiece 200 held by the chuck table 30, by movement of the sheet holding plates 41 between the holding positions and the holding release positions, suction by the vacuum drive source, and stopping of the suction. Note that the upper surfaces of the sheet holding plates 41 of each sheet holding section 40 are disposed above the holding surface 31 of the chuck table 30.

The cutting section 50 is for cutting the sheet 210 attached to the workpiece 200 held by the chuck table 30, along the outer edge 206 of the workpiece 200. The cutting section 50 includes a cutter 51 that cuts into the sheet 210 to cut the sheet 210; a rotating roller 52 as a pressing section that presses the unnecessary part 212 of the cut sheet 210, the unnecessary part being on the periphery side of the workpiece 200, toward the sheet accommodating section 21; a clamping roller 53 that clamps the sheet 210 between itself and the chuck table 30; and a moving unit 54 (depicted in FIG. 1) that lifts and lowers the cutter 51, the rotating roller 52, and the clamping roller 53 and move them in the circumferential direction of the chuck table 30.

The cutter 51 is supported by the moving unit 54, and a lower end of a cutting edge is disposed on the outer edge 206 of the workpiece 200 held by the chuck table 30. The cutter 51 is moved by the moving unit 54 along the outer edge 206 of the workpiece 200 held by the chuck table 30.

The rotating roller 52 is rotatably supported by a lower end part of a support column 55 supported by the moving unit 54, and is disposed on the side of the outer circumference of the chuck table 30 relative to the cutter 51. A lower end of the rotating roller 52 is disposed at the same height as that of the lower end of the cutting edge of the cutter 51.

The clamping roller 53 is rotatably supported by the lower end part of the support column 56 supported by the moving unit 54, and is disposed on the side of the inner circumference of the chuck table 30 relative to the cutter 51. A lower end of the clamping roller 53 is disposed above the lower end of the rotating roller 52 and the lower end of the cutting edge of the cutter 51.

The moving unit 54 lifts and lowers the cutter 51, the rotating roller 52, and the clamping roller 53 together, and moves the cutter 51, the rotating roller 52, and the clamping roller 53 together in the circumferential direction of the chuck table 30. The rotating roller 52 and the clamping roller 53 are moved together with the cutter 51 in the circumferential direction of the chuck table 30 relative to the sheet 210, the rotating roller 52 rolls on the sheet 210 while moving relative to the sheet 210, to press the sheet 210 toward the sheet accommodating section 21, and the clamping roller 53 rolls on the sheet 210 while moving relative to the sheet 210, to press the sheet 210 toward the holding surface 31 of the chuck table 30. In this instance, since the lower end of the clamping roller 53 is disposed above the lower end of the rotating roller 52 and the lower end of the cutting edge of the cutter 51, the rotating roller 52 presses the unnecessary part 212 of the sheet 210 toward the sheet accommodating section 21 while moving in the circumferential direction relative to the sheet 210 together with the cutter 51 cutting into the sheet 210.

A control unit 100 is for controlling the constituent elements constituting the sheet attaching apparatus 1, to attach the sheet 210 to the front surface 203 side of the workpiece 200, and for causing the sheet attaching apparatus 1 to perform a sheet attaching operation of cutting the sheet 210 along the outer edge 206 of the workpiece 200. The control unit 100 is a computer that has an arithmetic processing device having a microprocessor such as a central processing unit (CPU), a storage device having a memory such as a read only memory (ROM) or a random access memory (RAM), and an input-output interface device, and that can execute a computer program.

The arithmetic processing device of the control unit 100 executes the computer program stored in the ROM on the RAM, to generate control signals for controlling the sheet attaching apparatus 1. The arithmetic processing device of the control unit 100 outputs the generated control signals to the constituent elements of the sheet attaching apparatus 1 through the input-output interface device.

In addition, the control unit 100 is connected to a display unit including a liquid crystal display for displaying a processing operation state, images, and the like, and an input unit used when an operator registers processing contents information or the like. The input unit includes at least one of a touch panel provided on the display unit and a keyboard and the like.

Figure 4:
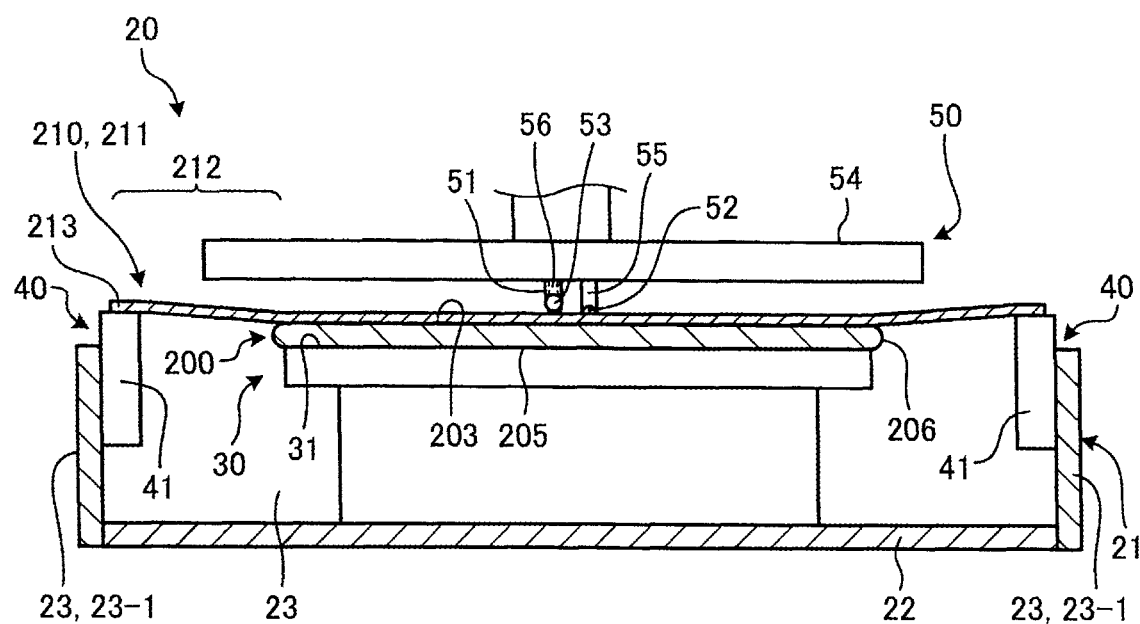
FIG. 4 is a sectional view schematically depicting a state in which a cutter of the sheet cutting section depicted in FIG. 1 is cutting into the sheet attached to the workpiece held by a chuck table.
Figure 5:
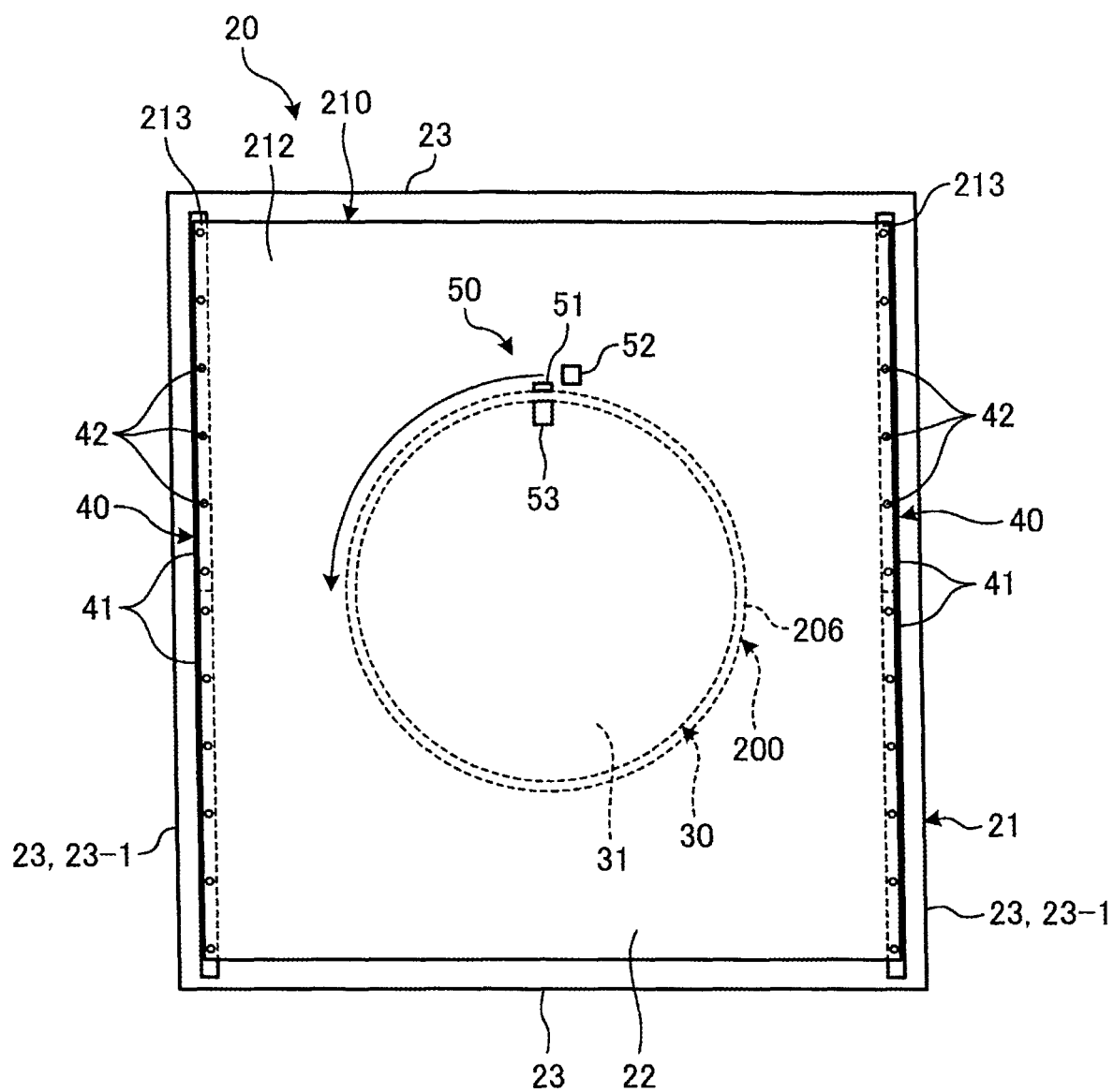
FIG. 5 is a plan view schematically depicting the sheet cutting section depicted in FIG. 4.
Figure 6:
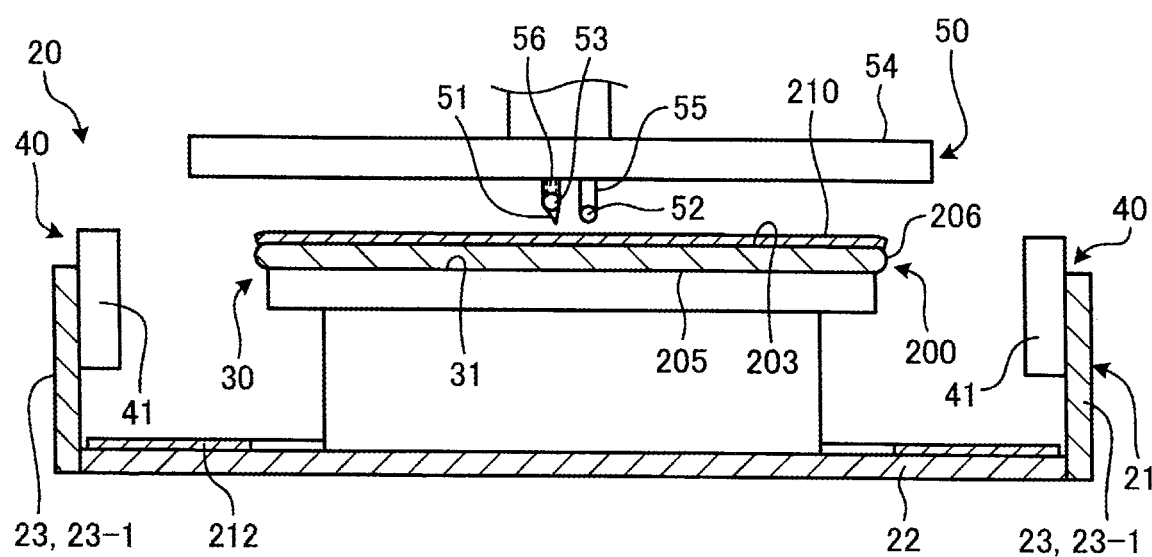
FIG. 6 is a sectional view schematically depicting a state in which the sheet cutting section depicted in FIG. 4 has cut the sheet attached to the workpiece held by the chuck table and an unnecessary part of the sheet is accommodated in a sheet accommodating section.
Figure 7:
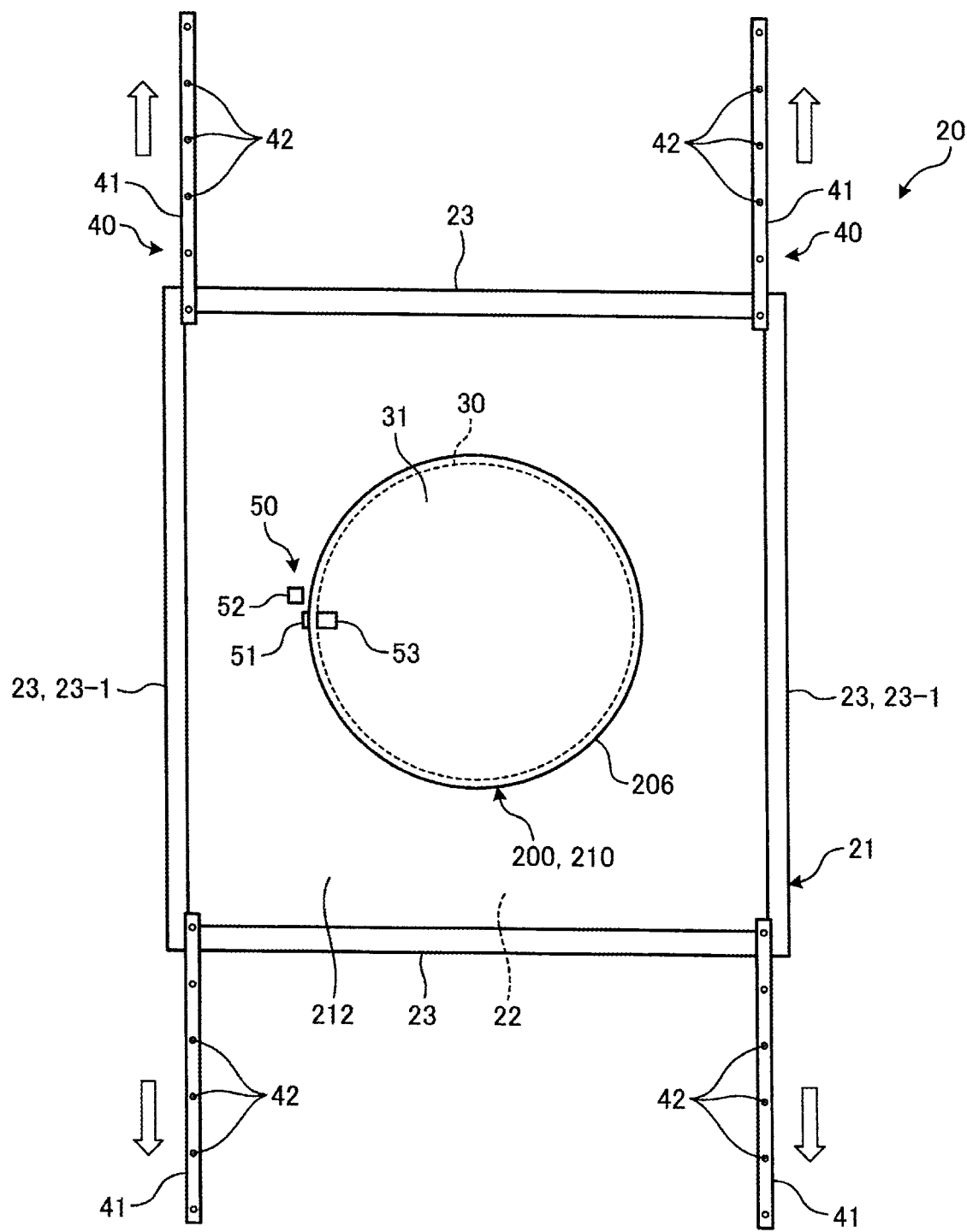
FIG. 7 is a plan view schematically depicting the sheet cutting section depicted in FIG. 6.

Next, a sheet attaching operation of the sheet attaching apparatus 1 having the above-mentioned configuration will be described based on the drawings. FIG. 4 is a sectional view schematically depicting a state in which the cutter of the sheet cutting section depicted in FIG. 1 cuts into the sheet attached to the workpiece held by the chuck table. FIG. 5 is a plan view schematically depicting the sheet cutting section depicted in FIG. 4. FIG. 6 is a sectional view schematically depicting a state in which the sheet cutting section depicted in FIG. 4 cuts the sheet attached to the workpiece held by the chuck table and the unnecessary part of the sheet is accommodated in the sheet accommodating section. FIG. 7 is a plan view schematically depicting the sheet cutting section depicted in FIG. 6.

In the sheet attaching apparatus 1 having the above-mentioned configuration, the control unit 100 controls the constituent elements, to perform a sheet attaching operation. In the sheet attaching operation, the sheet attaching section 2 of the sheet attaching apparatus 1 attaches the sheet 210 to the front surface 203 of the workpiece 200, as mentioned above. In the sheet attaching apparatus 1, the conveying unit conveys the workpiece 200 with the sheet 210 attached to the front surface 203 thereof from the sheet attaching section 2 to the sheet cutting section 20, puts the workpiece 200 on the holding surface 31 of the chuck table 30, and places the peripheral part 213 of the sheet 210 on the upper surfaces of the sheet holding plates 41 positioned at the holding positions. In this instance, the sheet attaching apparatus 1 disposes the chuck table 30 and the workpiece 200 at such positions as to be coaxial with each other.

The sheet attaching apparatus 1 holds under suction the peripheral part 213 of the sheet 210 on the upper surfaces of the sheet holding plates 41 of the sheet holding sections 40, lowers the cutter 51 of the cutting section 50, the rotating roller 52, and the clamping roller 53 by the moving unit 54, and, as depicted in FIGS. 4 and 5, causes the cutting edge of the cutter 51 to cut into the sheet 210, causes the rotating roller 52 to press the unnecessary part 212 of the sheet 210, and causes the clamping roller 53 to press the sheet 210 on the holding surface 31 of the chuck table 30. The sheet attaching apparatus 1 rotates the cutter 51 of the cutting section 50, the rotating roller 52, and the clamping roller 53 at least one revolution in the circumferential direction of the chuck table 30 by the moving unit 54, and cuts the sheet 210 along the outer edge 206 over the whole circumference of the workpiece 200 by the cutter 51. In this instance, since the lower end of the rotating roller 52 is disposed below the lower end of the clamping roller 53, the unnecessary part 212 of the cut sheet 210, the unnecessary part 212 being on the periphery side relative to the outer edge 206 of the workpiece 200, is positioned below the part attached to the workpiece 200. In addition, at the time of cutting the sheet 210, the rotating roller 52 is positioned on the rear side in the moving direction relative to the cutter 51 moved in the circumferential direction of the chuck table, and the sheet 210 having been cut by the cutter 51 is securely pressed down toward the sheet accommodating section by the rotating roller.

The sheet attaching apparatus 1 stops suction of the sheet 210 on the sheet holding plates 41 of the sheet holding sections 40, moves the sheet holding plates 41 to the holding release positions, and lifts the cutter 51, the rotating roller 52, and the clamping roller 53 by the moving unit 54. Then, as depicted in FIGS. 6 and 7, the unnecessary part 212 of the sheet 210, the unnecessary part 212 being on the periphery side relative to the outer edge 206 of the workpiece 200 yet to be cut, is dropped into the sheet accommodating section 21, and is accommodated in the sheet accommodating section 21. In this way, the sheet attaching apparatus 1 forms the sheeted workpiece 211 (the body including the workpiece 200 and the disk-shaped sheet 210 that is attached to the workpiece 200 and that has the same diameter as that of the workpiece 200).

The sheet attaching apparatus 1 according to the embodiment described above includes the rotating roller 52 as a pressing section for pressing the unnecessary part 212 of the sheet 210 having been cut by the cutting section 50 toward the sheet accommodating section 21, and therefore, the unnecessary part 212 of the sheet 210 can securely be separated from the part for forming the sheeted workpiece 211 attached to the workpiece 200. As a result, the sheet attaching apparatus 1 produces an effect that the phenomenon in which the unnecessary part 212 of the sheet 210 having been attached to the workpiece 200 makes contact with the workpiece 200 and becomes difficult to be dropped can be dissolved, and that the unnecessary part 212 of the sheet 210 having been attached to the workpiece 200 can easily be removed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A sheet attaching apparatus for attaching a sheet to a plate-shaped workpiece to form a sheeted workpiece, the sheet attaching apparatus comprising:
  a sheet attaching section that attaches the sheet having an area larger than that of the workpiece to the workpiece; and
  a sheet cutting section that cuts off the sheet attached by the sheet attaching section from the workpiece along a periphery of the workpiece,
  wherein the sheet cutting section includes
  a chuck table that holds the workpiece by a holding surface smaller than the workpiece,
  a sheet holding section including sheet holding plates that are movable toward and away from each other, wherein the sheet holding plates detachably hold a peripheral portion of the sheet attached to the workpiece held by the chuck table, and wherein the sheet holding plates are movable between a holding position in which the sheet holding plates hold the peripheral portion of the sheet, and a holding release position in which the sheet holding plates move away from the peripheral portion of the sheet,
  a sheet accommodating section that accommodates the sheet cut and dropped due to release of holding by the sheet holding section, and
  a cutter of the sheet cutting section that cooperates with a pressing section that presses the cut sheet toward the sheet accommodating section.

2. The sheet attaching apparatus according to claim 1, wherein the pressing section is a rotating roller that presses the sheet while moving relative to the sheet together with the cutter.

3. The sheet attaching apparatus according to claim 1, wherein the sheet holding plates include upper surfaces having a plurality of suction holes.

4. The sheet attaching apparatus according to claim 1, wherein the cutting section further includes a rotating roller and the pressing section includes a clamping roller, and wherein the rotating roller and the clamping roller are positioned on opposing sides of a peripheral edge of the workpiece.

* * * * *